United States Patent
Ramsamy et al.

(10) Patent No.: US 12,432,861 B2
(45) Date of Patent: Sep. 30, 2025

(54) METHOD FOR MANUFACTURING A SENSOR COMPRISING AT LEAST TWO SEPARATE ELECTRODES, AND SENSOR

(71) Applicant: Linxens Holding, Mantes-la-Jolie (FR)

(72) Inventors: Catheline Ramsamy, Buchelay (FR); Nicolas De Guillebon, Buchelay (FR); Simon Vassal, Buchelay (FR)

(73) Assignee: Linxens Holding, Mantes-la-Jolie (FR)

( * ) Notice: Subject to any disclaimer, the term of this patent is extended or adjusted under 35 U.S.C. 154(b) by 232 days.

(21) Appl. No.: 18/555,031

(22) PCT Filed: Apr. 13, 2022

(86) PCT No.: PCT/EP2022/059938
§ 371 (c)(1),
(2) Date: Oct. 12, 2023

(87) PCT Pub. No.: WO2022/219074
PCT Pub. Date: Oct. 20, 2022

(65) Prior Publication Data
US 2024/0224429 A1 Jul. 4, 2024

(30) Foreign Application Priority Data
Apr. 14, 2021 (FR) ........................ 2103854

(51) Int. Cl.
*H05K 1/02* (2006.01)
*C25D 5/10* (2006.01)
*C25D 7/00* (2006.01)
*H05K 3/10* (2006.01)

(52) U.S. Cl.
CPC ............. *H05K 3/107* (2013.01); *C25D 5/10* (2013.01); *C25D 7/00* (2013.01); *H05K 1/028* (2013.01)

(58) Field of Classification Search
CPC ............................ H05K 1/028; H05K 3/107
See application file for complete search history.

(56) References Cited

U.S. PATENT DOCUMENTS

| 11,635,404 | B2 * | 4/2023 | Shaltry | .............. G01N 27/3272 |
| | | | | 429/63 |
| 2015/0276651 | A1 * | 10/2015 | Petisce | ..................... C23F 1/26 |
| | | | | 216/13 |
| 2019/0154620 | A1 | 5/2019 | Wieder | |

FOREIGN PATENT DOCUMENTS

WO WO 2021/005279 A1 1/2021

OTHER PUBLICATIONS

Mohammadzadeh, A. et al., "Electroplating of Multiple Materials in Parallel Using Patterned Gels with Applications in Electrochemical Sensing," Sensors, vol. 20, No. 3, Feb. 7, 2020.

(Continued)

*Primary Examiner* — Sherman Ng
(74) *Attorney, Agent, or Firm* — McCarter & English LLP (57) ABSTRACT

A process for manufacturing a sensor including at least two electrodes, including providing a flexible dielectric substrate having a layer of electrically conductive material on at least one of its sides. The electrodes, conductive connecting tracks and a common current supply track are etched in the layer of electrically conductive material. The process further includes electrodepositing one or more layers on the two electrodes and a step of selectively depositing, electrochemically, on at least one electrode, at least one layer of a material different from the one or more materials already deposited on another electrode.

15 Claims, 4 Drawing Sheets

(56) References Cited

OTHER PUBLICATIONS

Baracu, A.M. et al., "Review-Recent Advances in Microfabrication, Design and Applications of Amperometric Sensors and Biosensors," Journal of the Electrochemical Society, vol. 168, Mar. 2, 2021.
Dhand, C. et al., "Polyaniline-based biosensors," Nanobiosensors in Disease Diagnosis, Jul. 1, 2015.
Linxens, "Biosensor solutions for Point of Care diagnostics," Nov. 13, 2020.

* cited by examiner

METHOD FOR MANUFACTURING A SENSOR COMPRISING AT LEAST TWO SEPARATE ELECTRODES, AND SENSOR

CROSS REFERENCE TO RELATED APPLICATION

This patent application is a U.S. National Stage application of International Patent Application Number PCT/EP2022/059938 filed Apr. 13, 2022, which is hereby incorporated by reference in its entirety, and claims priority to FR 2103854 filed Apr. 14, 2021.

TECHNICAL FIELD

The invention relates to the field of sensors intended to be used to carry out measurements using at least two separate electrodes. For example, these electrodes are used to measure a potential difference, a current, an AC impedance, etc. Sensors of this type are intended, for example, to carry out measurements in chemistry, in the food industry, to inspect water quality in swimming pools, etc. For example, sensors of this type make it possible to measure pH (potential of hydrogen), or the chlorine concentration of a solution, etc. More particularly, it is a question of disposable sensors taking the form of flexible strips equipped with at least two electrodes.

PRIOR ART

For example, patent application KR20200132389A discloses a sensor configured to measure pH based on the potential difference between two electrodes produced on a flexible dielectric substrate, using screen-printing, ink-jet and photolithography techniques.

The aim of the invention is notably to provide a process for manufacturing a sensor comprising at least two electrodes, that is different from those of the prior art.

SUMMARY OF THE INVENTION

To this end, a process for manufacturing a sensor comprising at least two electrodes is provided, this process notably comprising the following steps:
  a) providing a flexible dielectric substrate with two main sides, called the front side and back side respectively, the front side being at least partially covered with a layer of a first electrically conductive material,
  b) etching, in the layer of the first material, at least a first electrode and a second electrode, and at least first and second connecting tracks that are conductive and each respectively connected to a common current supply track, each of these first and second connecting tracks being configured to be connected to the first electrode and to the second electrode, respectively (thus the "common current supply track" is common to the first and second connecting tracks and is, therefore, common to the first electrode and to the second electrode), and
  c) electrodepositing at least one conductive material on at least one of the two electrodes.

This process further comprises a step d) of selectively depositing, electrochemically, on the second electrode, at least one layer of a material different from the one or more materials deposited on the first electrode in step c).

This step d) comprises a disconnecting step d') consisting in electrically isolating at least the first electrode from the common current supply track, the second electrode remaining electrically connected to the common current supply track. After the disconnecting step d'), this process also comprises at least one step d") of forming, electrochemically, on the second electrode, at least one layer of a material different from the one or more materials deposited on the first electrode in step c).

Thus, the second electrode may be supplied with current by way of the common current supply track in order to carry out electrochemical deposition, whereas the first electrode may no longer be supplied with this current and may therefore no longer participate in this electrochemical deposition. This process therefore makes it possible to selectively deposit a material on the second electrode and thus to produce, on the same substrate, at least two electrodes having different structures. For example, one of these structures is configured to form a working electrode intended to measure pH, while the other structure is configured to form a reference electrode.

This process makes it possible to produce all or some of each of the electrodes electrochemically (notably the etch of the layer of the first electrically conductive material, then the electrodeposition of one or more layers on at least one of the two electrodes). Now, electrochemical processes are advantageous in terms of production speed and production cost. Hence, the more steps able to be performed electrochemically, the more production cost may be decreased. This is an undeniable advantage, especially when it comes to manufacturing single-use products.

This process also optionally comprises one or more of the following features, each either independently of the others or in combination with one or more others:
  said at least one layer of a material different from the one or more materials deposited on the first electrode in step c) is a layer of conductive polyaniline, of emeraldine form (for pH measurements for example);
  said at least one layer of a material different from the one or more materials deposited on the first electrode in step c) is a layer of gold (for measurements of chlorine concentration for example);
  the first electrically conductive material at least partially covering the front side of the substrate is formed from a metal layer laminated on the substrate, this metal layer comprising one of the following metals, or an alloy thereof: copper, aluminum, steel;
  a second electrically conductive material at least partially covering the back side of the substrate is formed from a metal layer laminated on the substrate, this metal layer comprising one of the following metals, or an alloy thereof: copper, aluminum, steel;
  the first electrode and the second electrode are produced on the front side, and electrically conductive connecting tracks are formed on the back side;
  conductive vias are produced through the substrate to connect the electrodes to the common current supply track, by way of the connecting tracks;
  in step c), electrodepositing at least one material on at least one of the electrodes comprises depositing at least one layer of a metal selected from the list containing nickel, gold, silver, copper, platinum, palladium;
  in step c), electrodepositing at least one material on at least one of the electrodes comprises depositing, on the first electrode, a layer of nickel, then depositing a layer of gold, then depositing a layer of silver;
  step c) of electrodepositing at least one material on at least one of the electrodes comprises depositing, on the second electrode, a layer of nickel, then depositing a layer of gold, this step c) being prior to step d") of forming a layer of polyaniline;

the process comprises etching, in the layer of the first material, a third electrode and depositing, on this third electrode, at least one layer of a metal selected from the list containing nickel, gold, silver, copper, platinum, palladium;

the process comprises a step, subsequent to step c), of depositing, on the first electrode, a layer of silver chloride or of carbon using a technique selected from the list containing screen printing, jet printing and electrodeposition; and the process comprises a step of selective masking during at least one electrodeposition of a material on at least one of the electrodes.

According to another aspect, an electrical circuit for a measurement sensor is provided, for example a measurement sensor manufactured according to the process described above. This sensor comprises at least two electrodes. More particularly, it comprises a) a flexible dielectric substrate with two main sides, called the front side and back side respectively, b) at least first and second electrodes produced in a layer of a first electrically conductive material, which layer is borne by the front side, and at least first and second conductive connecting tracks, each connected to the first electrode and to the second electrode, respectively.

In this sensor, the second electrode is at least partially covered with at least one layer of a material different from the one or more materials deposited on the first electrode, this layer having a structure corresponding to a layer formed using an electrochemical process.

This sensor also optionally comprises one or more of the following features, each either independently of the others or in combination with one or more others:

said at least one layer of a material different from the one or more materials deposited on the first electrode is a layer of conductive polyaniline, of emeraldine form;

the first electrode and the second electrode comprise the same stack of layers electrodeposited on the layer of first electrically conductive material, this stack being at least partially covered with a layer of silver chloride on the first electrode and with the layer of polyaniline on the second electrode; and it comprises an antenna and an electronic RFID chip (RFID standing for Radio-Frequency IDentification).

BRIEF DESCRIPTION OF THE DRAWINGS

Other features and advantages of the invention will become apparent on reading the following detailed description, and from the appended drawings. In these drawings.

DETAILED DESCRIPTION

Figure 1:
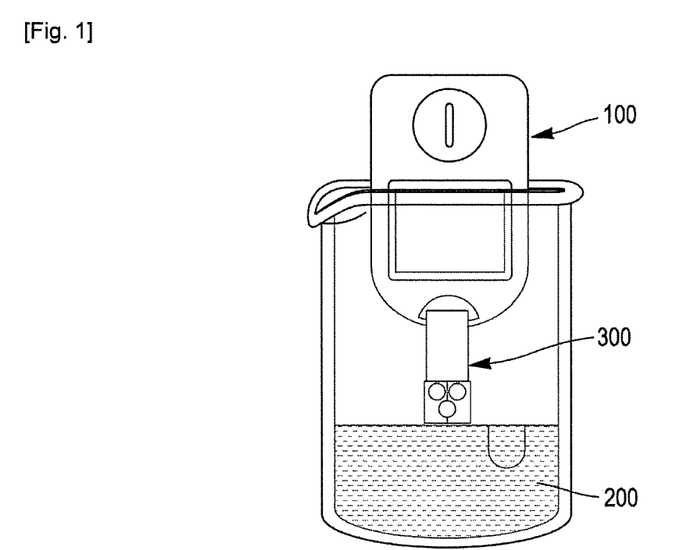
FIG. 1 schematically shows, in perspective, according to a first example of implementation, a device equipped with an example of a sensor according to the present invention.

FIG. 1 shows a device 100 for measuring, for example, the pH of a solution 200, said device being equipped with a sensor 300 according to the invention.

Such a sensor 300 is for example produced using a flexible dielectric substrate 310 on which rests a layer of a first electrically conductive material 320. For example, the substrate 310 is made of glass-epoxy, or of polyethylene terephthalate (PET), or of polyimide (PI), etc. The substrate 310 has, for example, a thickness comprised between 25 and 300 microns, and more preferably comprised between 50 and 200 microns. The first electrically conductive material 320 is, for example, one of the following metals, or one of the alloys thereof: copper, aluminum, steel. The first electrically conductive material 320 has, for example, a thickness comprised between 12 and 70 microns. For example, the first conductive material 320 is laminated onto the dielectric substrate 310 directly, or with a layer of adhesive material therebetween, to form a laminate. This laminate is advantageously provided in the form of a roll, the process according to the invention then advantageously being implemented roll-to-roll. Alternatively, the laminate is provided in sheets.

According to a first example of implementation of the process according to the invention, the laminate is a single-sided laminate. For example, it is a copper-clad laminate consisting of a PET substrate 310 the thickness of which is 150 μm, to which has been transferred a layer of the first material 320, namely copper of 18 μm thickness in this example. This laminate undergoes a certain number of operations known to those skilled in the art, such as production of sprocket holes 330 by perforation, and etching of conductive tracks (current supply tracks 340 and connecting tracks 342) in the layer of the first conductive material 320, for example, by electrochemical etching of patterns 322 defined by photolithography.

Figure 2:
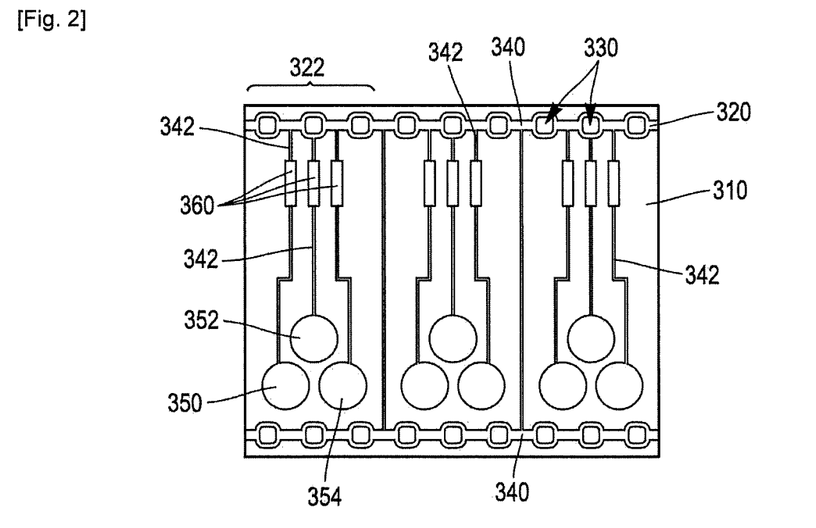
FIG. 2 schematically shows, seen from above, a substrate equipped with electrodes, at an intermediate stage in the course of a first example of a process for manufacturing a sensor according to the invention.

At the end of these first operations, a strip such as that shown in FIG. 2 is obtained. FIG. 2 shows only three patterns 322, each corresponding to one sensor 300. Of course, the strip may comprise many other patterns 322 identical to those shown, notably when the strip is supplied in a roll. Each pattern 322 comprises:

three electrodes 350, 352, 354: corresponding to a working electrode 350, a reference electrode 352 and a counter electrode 354, respectively, current supply tracks 340 on each of the longitudinal edges of the strip, connecting tracks 342 electrically connected to the current supply tracks 340, contacts 360 electrically connected, each respectively, by the connecting tracks 342, on the one hand, to the current supply tracks 340 and, on the other hand, to the electrodes 350, 352, 354.

At this stage, the first material 320 is still bare. The strip then undergoes a number of electrodeposition steps in which a layer of nickel 323 (with a minimum thickness of 2 µm for example) and a layer of gold 324 (with a maximum thickness of 0.2 µm for example) are successively deposited. See FIG. 3.

Figure 3:
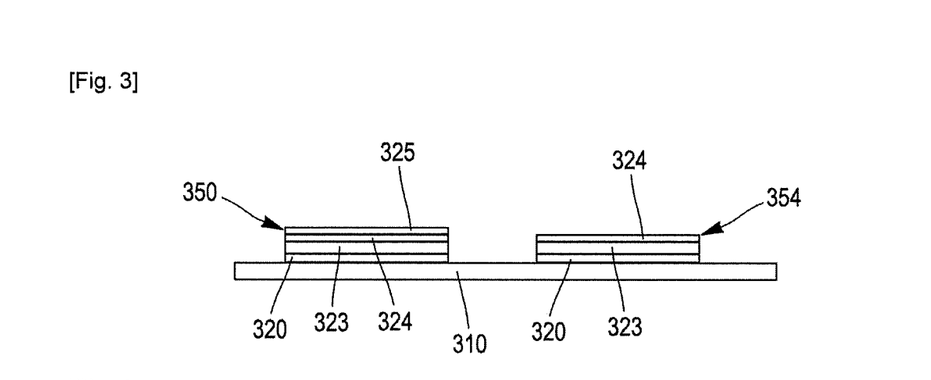
FIG. 3 schematically shows, in cross section, the various layers located in the working electrode and in the reference electrode, in one example of embodiment of a sensor according to the invention.

At this stage, the three electrodes 350, 352, 354 have undergone the same processing and are covered with the same stack of conductive layers.

According to a first variant of the embodiment described with reference to FIGS. 2 to 5, the reference electrode 352 and the counter electrode 354 are electrically isolated from the working electrode 350 (see FIG. 5). For example, the segment of the connecting tracks 342 that is located between the current supply track 340 and the respective contacts 360 of these electrodes 352, 354 is cut by punching, forming a hole 370 through the substrate 310, the layer of first material 320 and all of the conductive layers 323, 324 deposited on the layer of first material 320. Alternatively, this segment of the connecting tracks 342 may be cut by laser ablation, by electrochemical etching, or any other appropriate process. However, use of a step (punching, etching, etc.) of disconnecting at least one of the electrodes does not necessarily exclude use of selective masking to produce a deposit on this electrode or another electrode, before or after this disconnecting step.

The patterns 322 may then undergo a new electrodeposition intended to cover the working electrode 350 with a conductive material 325 different from the one covering the reference electrode 352 and the counter electrode 354. Thus, this different conductive material 325 may be aniline, which undergoes in the course of this deposition an electro-polymerization reaction that makes it possible to obtain, on the working electrode 350, a layer of conductive polyaniline, of emeraldine-salt form. For example, the layer of polyaniline formed has a thickness smaller than 20 microns. Alternatively, other types of conductive polymers (polypyrroles, polyacrylic acid PAA, polymethacrylic acid PMAA, etc.) may be deposited.

Still according to this first variant of the embodiment described with reference to FIGS. 2 to 5, a layer of silver chloride 326 is deposited on the reference electrode 352, for example by jet printing or screen printing. For example, the deposited layer of silver chloride has a thickness smaller than 100 microns.

According to a second variant of the embodiment described with reference to FIGS. 2 to 5, only the counter electrode 354 is electrically isolated from the working electrode 350 and from the reference electrode 352 (see FIG. 4). For example, the segment of the connecting track 342 located between the current supply track 340 and the contact 360 of the counter electrode 354 is cut by punching, forming a hole 370 through the substrate 310, the layer of first material 320 and all of the conductive layers 323, 324 deposited on the layer of first material 320. Alternatively, this segment of connecting track 342 may be cut by laser ablation, by electrochemical etching, or any other appropriate process. One of the other two electrodes 350, 352 is masked, for example using a resin, or appropriate selective masking applied in the electrolytic bath intended to receive the strip with a view to electrodepositing a specific layer on the electrode remaining uncovered. For example, the working electrode 350 is thus masked. A layer of silver having a maximum thickness of 10 microns is deposited electrochemically on the reference electrode 352. This deposition is followed by a step of surface chlorination so as to form a surface layer of silver chloride (thickness smaller than 1 micron).

Figure 4:
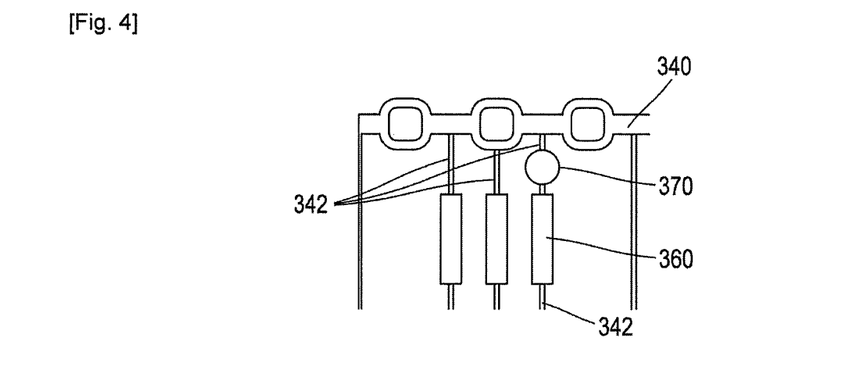
FIG. 4 schematically shows, seen from above, one portion of the substrate shown in FIG. 2, at a later stage of the first example of a process for manufacturing a sensor according to the invention.
Figure 5:
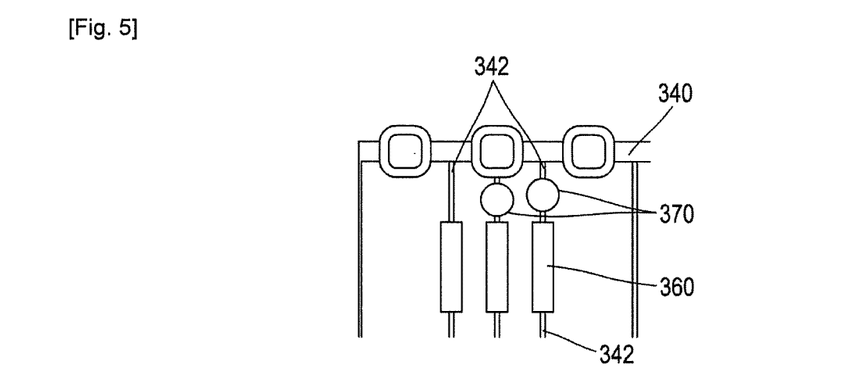
FIG. 5 is a view similar to that of FIG. 4, at a later stage, with respect to the stage corresponding to FIG. 2 and/or FIG. 4, of the first example of a process for manufacturing a sensor according to the invention.

In this case, after this layer of silver chloride has been formed, the segment of the connecting track 342 located between the current supply track 340 and the contact 360 of the reference electrode 352 is cut by punching, forming a hole 370 through the substrate 310, the layer of first material 320 and all of the conductive layers deposited on the layer of first material 320 (see FIG. 4). Alternatively, this segment of connecting track 342 may be cut by laser ablation, by electrochemical etching, or any other appropriate process.

The patterns 322 may then undergo a new electrodeposition intended to cover solely the working electrode 350 with a conductive material different from the one covering the reference electrode 352 and the counter electrode 354. Thus, this different conductive material may be aniline, which undergoes in the course of this deposition an electro-polymerization reaction that makes it possible to obtain, on the working electrode 350, a layer of conductive polyaniline, of emeraldine-salt form. For example, the layer of polyaniline formed has a thickness smaller than 10 microns.

Figure 6:
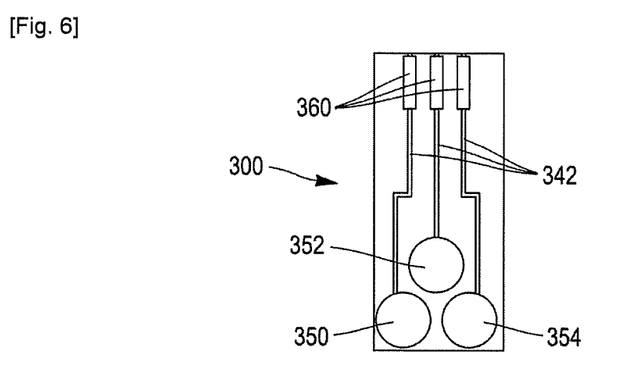
FIG. 6 schematically shows, seen from above, the sensor obtained using the process illustrated in FIGS. 2 to 5.

At the end of the steps described above, a strip with a plurality of sensor patterns 322 is obtained. To obtain the sensor 300 of FIG. 6, the patterns 322 are cut/individualized and the edge (with the current supply tracks) is removed. Said sensor comprises a working electrode 350, a reference electrode 352 and a counter electrode 354, which are each connected to one contact 360 by one connecting track 342, respectively.

According to a second example of implementation of the process according to the invention, the laminate is a double-sided laminate. For example, it is a laminate consisting of a substrate 310 of epoxy glass of PET or of PI, the thickness of which is comprised between 25 and 300 microns, and to which has been transferred a layer of a first conductive material 320, in the present case copper of 12 to 70 microns thickness, on one side, called the front side, and of a second conductive material 321, in the present case copper of 12 to 70 microns thickness, on the other side, called the back side. This laminate undergoes a certain number of operations known to those skilled in the art, such as production of sprocket holes 330 and of vias 380 by perforation, etching of conductive tracks (current supply tracks 340 and connecting tracks 342) in the layers of conductive material covering the front and back sides, for example by electro-chemical etching of patterns defined by photolithography, and production of a conductive deposit in the vias 380.

Figure 7:
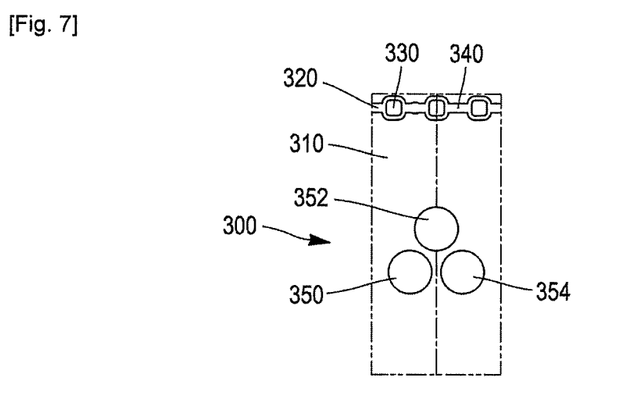
FIG. 7 schematically shows, seen from above, a substrate equipped with electrodes, at an intermediate stage in the course of a second example of a process for manufacturing a sensor according to the invention.
Figure 8:
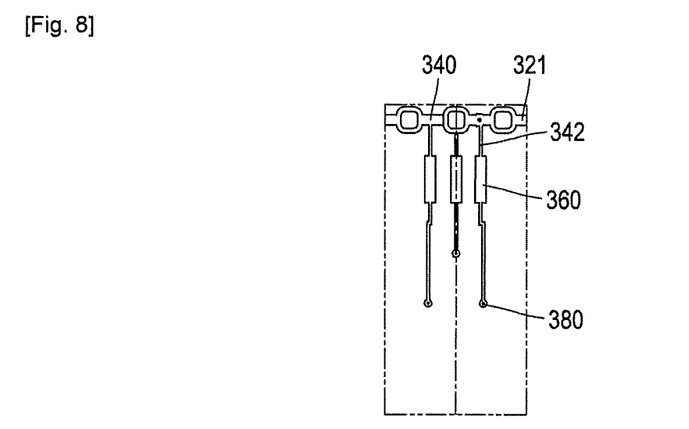
FIG. 8 schematically shows, seen from below, the substrate shown in FIG. 7.

At the end of these first operations, a strip such as the one shown in FIGS. 7 and 8 is obtained. FIGS. 7 and 8 show only one pattern, corresponding to one sensor 300. Of course, the strip may comprise many other patterns identical to those shown, notably when the strip is supplied in a roll. Each pattern comprises:
  conductive vias 380 through the substrate 310,
  on the front side, three electrodes 350, 352, 354: corresponding to a working electrode 350, a reference electrode 352 and a counter electrode 354, respectively, and current supply tracks 340 on each of the longitudinal edges of the strip,
  on the back side, current supply tracks 340 on each of the longitudinal edges of the strip and contacts 360 electrically connected, each respectively, by connecting tracks 342, on the one hand to the current supply tracks 340 on the back side, and on the other hand to the vias

380, which are formed of conductive blind holes that are closed, each respectively, on the front side by an electrode 350, 352 or 354 to which they are thus electrically connected.

At this stage, the conductive material partially covering the front and back sides is still bare. The strip then undergoes a number of electrodeposition steps in which a layer of nickel and a layer of gold are successively deposited (alternatively, a layer of silver and therefore not gold may be deposited on the layer of nickel). One advantage of this mode of implementation of the process according to the invention resides in the fact that the back side may be masked so that these electrodeposits are produced only on the electrodes 350, 352, 354, thus making the process according to the invention more economical.

Variants similar to those described in relation to the first example of implementation of the process according to the invention are then implemented so as to selectively produce a layer of polyaniline on the working electrode 350 (which comprises a layer of gold subjacent to the layer of polyaniline and a layer of nickel subjacent to the layer of gold) and a layer of silver chloride on the reference electrode 352 (which comprises a layer of silver subjacent to the layer of silver chloride, a layer of gold subjacent to the layer of silver and a layer of nickel subjacent to the layer of gold), while the counter electrode 354 comprises only a layer of gold or of silver and a layer of nickel subjacent to the layer of gold.

Other modes of implementation and other variants of the process according to the invention may be configured to produce sensors 300 comprising specific stacks of conductive layers, differing from one electrode to another. These stacks are chosen depending on the application for which the sensor 300 is intended. For example, for a measurement of chlorine concentration, the working electrode 350 may be coated with a surface layer of gold (and therefore not polyaniline) that will optionally be thicker (for example, this layer has a thickness comprised between 0.2 and 1 micron) than in the examples described above, the reference electrode 352 and the counter electrode 354 remaining similar to those described in relation to these same examples.

The sensor 300 may also have a different form factor to those shown in FIGS. 1 to 8 and described above. For example, it may have a shape suitable for integration, for example, into a smart card, or into a transponder card comprising an identification chip and an antenna.

Figure 9:
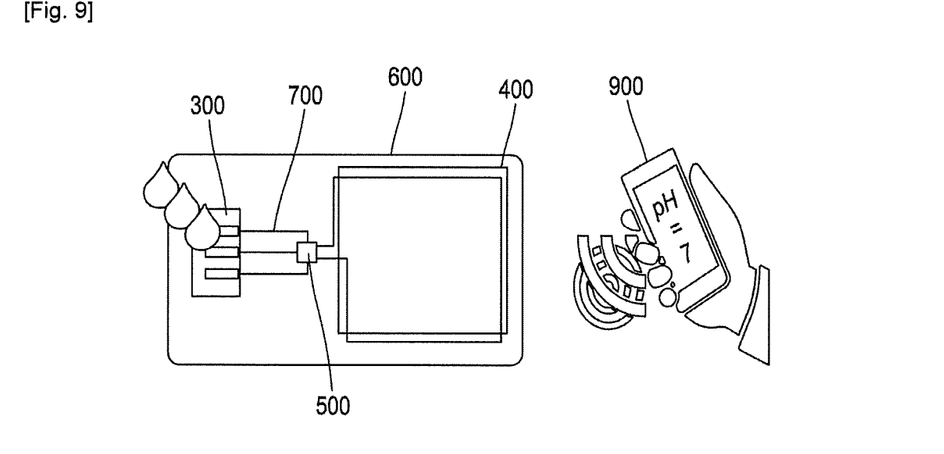
FIG. 9 schematically shows, according to a second example of implementation, a card equipped with one example of a sensor according to the present invention.

For example, as shown in FIG. 9, the sensor 300 such as described above with reference to FIGS. 7 and 8 (the electrodes here being shown as being of rectangular shape instead of the round shape shown in FIG. 7) is integrated into a cavity produced in the body of a card 600. The card 600 comprises an electrical circuit, for example taking the form of a wire 700 embedded in an inlay, itself integrated into the body of the card 600 between constituent layers of plastic thereof. During formation of the cavity, ends of the wire 700 are exposed. When the sensor 300 is integrated into the cavity, the exposed ends of the wire 700 are connected (by known techniques: solder joints, anisotropic conductive films, etc.) to the contacts 360 located on the back side of the sensor 300. These ends are themselves connected to a chip 500 integrated into the electrical circuit formed on the inlay. Likewise, this electrical circuit comprises an antenna 400 connected to the chip 500. It is then possible to take one or more measurements using the card 600, with a view to analyzing a liquid, then to read these measurements from a memory of the chip 500, for example using a smartphone 900 that communicates with the chip 500, for example by virtue of the NFC communication protocol.

The invention claimed is:

1. A process for manufacturing a sensor comprising at least two electrodes, the process comprising the following steps:
   a) providing a flexible dielectric substrate with two main sides, called the front side and back side respectively, the front side being at least partially covered with a layer of a first electrically conductive material,
   b) etching, in the layer of the first material, at least a first electrode and a second electrode, and at least first and second connecting tracks that are conductive and each respectively connected to a common current supply track, each of these first and second connecting tracks being connected to the first electrode and to the second electrode, respectively,
   c) electrodepositing at least one conductive material on at least the first electrode,
   d) a step of selectively depositing, electrochemically, on the second electrode, at least one layer of a material different from the one or more materials deposited on the first electrode in step c),
   characterized in that step d) comprises a disconnecting step d') consisting in electrically isolating at least the first electrode from the common current supply track, the second electrode remaining electrically connected to the common current supply track, and, after the disconnecting step d'), at least one step d") of forming, electrochemically, on the second electrode, at least one layer of a material different from the one or more materials deposited on the first electrode in step c).

2. The process as claimed in claim 1, wherein said at least one layer of a material different from the one or more materials deposited on the first electrode in step c) is a layer of polyaniline.

3. The process as claimed in claim 1, wherein said at least one layer of a material different from the one or more materials deposited on the first electrode in step c) is a layer of gold.

4. The process as claimed in claim 1, wherein the first electrically conductive material at least partially covering the front side of the substrate is formed from a metal layer laminated on the substrate, this metal layer comprising one of the following metals, or an alloy thereof: copper, aluminum, steel.

5. The process as claimed in claim 1, wherein a second electrically conductive material at least partially covering the back side of the substrate is formed from a metal layer laminated on the substrate, this metal layer comprising one of the following metals, or an alloy thereof: copper, aluminum, steel.

6. The process as claimed in claim 5, wherein the first electrode and the second electrode are produced on the front side, and electrically conductive connecting tracks are formed on the back side.

7. The process as claimed in claim 5, wherein conductive vias are produced through the substrate to connect the electrodes to the common current supply track by way of the connecting tracks.

8. The process as claimed in claim 1, wherein, in step c), electrodepositing at least one material on at least the first electrode comprises depositing at least one layer of a metal selected from the list containing nickel, gold, silver, copper, platinum, and palladium.

9. The process as claimed in claim 1, comprising etching, in the layer of the first material, a third electrode and depositing, on this third electrode, at least one layer of a metal selected from the list containing nickel, gold, silver, copper, platinum, and palladium.

10. The process as claimed in claim 1, comprising a step, subsequent to step c), of depositing, on the first electrode, a layer of silver chloride or of carbon using a technique selected from the list containing screen printing, jet printing and electrodeposition.

11. The process as claimed in claim 1, comprising a step of selective masking during at least one electrodeposition of a material on at least one of the electrodes.

12. An electrical circuit for a measurement sensor comprising at least two electrodes, this electrical circuit comprising
  a) a flexible dielectric substrate with two main sides, called the front side and back side respectively,
  b) at least first and second electrodes produced in a layer of a first electrically conductive material, which layer is borne by the front side, and at least first and second conductive connecting tracks each connected, on the one hand, to the first electrode and to the second electrode, respectively, and on the other hand, to current supply tracks, characterized in that the second electrode is at least partially covered with at least one layer of a material different from the one or more materials deposited on the first electrode, the first electrode being disconnected from the current supply tracks and the second electrode being connected to the current supply tracks.

13. The electrical circuit as claimed in claim 12, wherein said at least one layer of a material different from the one or more materials deposited on the first electrode is a layer of polyaniline.

14. The electrical circuit as claimed in claim 13, wherein the layer of polyaniline has a structure corresponding to a layer formed using an electrochemical process.

15. The electrical circuit as claimed in claim 12, wherein the first electrode and the second electrode comprise the same stack of layers electrodeposited on the layer of first electrically conductive material, this stack being at least partially covered with a layer of silver chloride on the first electrode and with the layer of polyaniline on the second electrode.

* * * * *